United States Patent
Zeng et al.

(10) Patent No.: US 9,369,092 B2
(45) Date of Patent: Jun. 14, 2016

(54) FEED-FORWARD AMPLIFIER DEVICE AND METHOD THEREOF

(75) Inventors: Xiang Zeng, Beijing (CN); Changjiang Yang, Beijing (CN); Tao Huang, Beijing (CN)

(73) Assignee: Telefonaktiebolaget L M Ericsson, Stockholm (SE)

( * ) Notice: Subject to any disclaimer, the term of this patent is extended or adjusted under 35 U.S.C. 154(b) by 16 days.

(21) Appl. No.: 14/380,465

(22) PCT Filed: Feb. 24, 2012

(86) PCT No.: PCT/CN2012/071565
§ 371 (c)(1),
(2), (4) Date: Aug. 22, 2014

(87) PCT Pub. No.: WO2013/123669
PCT Pub. Date: Aug. 29, 2013

(65) Prior Publication Data
US 2015/0035603 A1    Feb. 5, 2015

(51) Int. Cl.
*H03F 1/26* (2006.01)
*H03F 1/32* (2006.01)
*H03F 3/24* (2006.01)
*H03F 3/19* (2006.01)
*H03F 3/21* (2006.01)

(52) U.S. Cl.
CPC ............ *H03F 1/3223* (2013.01); *H03F 1/3229* (2013.01); *H03F 3/19* (2013.01); *H03F 3/211* (2013.01); *H03F 3/24* (2013.01); *H03F 2200/336* (2013.01); *H03F 2200/451* (2013.01); *H03F 2203/21142* (2013.01)

(58) Field of Classification Search
CPC ........................... H03F 1/26; H03F 2201/3218
USPC .................................................. 330/149, 151
See application file for complete search history.

(56) References Cited

U.S. PATENT DOCUMENTS

| | | | |
|---|---|---|---|
| 6,141,377 A | 10/2000 | Sharper et al. | |
| 8,995,932 B2 * | 3/2015 | Wyville | H04B 1/525 330/149 |
| 2010/0097134 A1 | 4/2010 | Laske | |

FOREIGN PATENT DOCUMENTS

CN        1384602        12/2002

OTHER PUBLICATIONS

PCT Notification Concerning Transmittal of International Preliminary Report on Patentability (Chapter I) for Counterpart PCT Application No. PCT/CN2012/071565, (Sep. 4, 2014), 7 pages.
PCT International Search Report for Counterpart PCT Application No. PCT/CN2012/071565, (Nov. 15, 2012), 3 pages.

* cited by examiner

*Primary Examiner* — Steven J Mottola
(74) *Attorney, Agent, or Firm* — Patents on Demand, P.A.; Brian K. Buchheit; Scott M. Garrett

(57) ABSTRACT

The present application discloses a feed-forward amplifier device and the method thereof. The device comprises: a splitter for splitting an input signal into two portions; a non-linear amplifier for amplifying the input signal and producing inter-modulation products; a carrier canceling unit for generating pure inter-modulation products; a linear amplifier for amplifying the pure inter-modulation products; and a coupler for generating final output signal by counteracting the inter-modulation products with the amplified pure inter-modulation products; wherein the splitter and the carrier canceling unit are provided in digital base band. According to the present disclosure, pure inter-modulation products can be generated and adjusted more flexibly and more accurately in digital base band, and hence ideal output signal may be generated.

18 Claims, 6 Drawing Sheets

FEED-FORWARD AMPLIFIER DEVICE AND METHOD THEREOF

CROSS-REFERENCE TO RELATED APPLICATIONS

This application is a National stage of International Application No. PCT/CN2012/071565, filed Feb. 24, 2012, which is hereby incorporated by reference.

TECHNICAL FIELD

The present disclosure relates to a feed-forward amplifier device, more particularly, relates to a feed-forward amplifier device which can generate pure inter-modulation products in digital base band and the method thereof.

BACKGROUND

Unless otherwise indicated herein, the approaches described in this section are not prior art to the claims in this application and are not admitted to be prior art by inclusion in this section.

In the wideband RF telecommunication system, Multi-carrier signals used to be amplified simultaneously in one and the same power amplifier for cost reason.

FIG. 1 shows the block diagram of a feed-forward amplifier.

As shown in FIG. 1, an input signal is split into two branches, one for a non-linear amplifier to be amplified and the other for generating pure inter-modulation products.

In the first branch, the non-linear amplifier will amplify the input signal and produce the inter-modulation products. A small part of non-linear amplifier output with amplified input signal and inter-modulation products will be coupled and opposite phased. In the second branch, the input signal will be fed-forward to produce the opposite phased inter-modulation products (i.e., pure inter-modulation products) with the coupled non-linear amplifier's output signal. Next, a linear amplifier will amplify this opposite phased inter-modulation products into proper amplitude, and then add it to the non-linear amplifiers output to cancel the inter-modulation products. At last, an intentional output signal without inter-modulation products will be generated and output.

One problem in this solution is that actual output signal cannot be observed or checked, thus the quality of the actual output signal cannot be insured. Further, the opposite phased inter-modulation products are produced in analog domain thus cannot be dynamically adjusted in their amplitude, phase and delay in accordance with the real-time inter-modulation products of the non-linear amplifier output. As a result, it is impossible to dynamically optimize actual output signal to an ideal intentional signal.

Therefore, there is a need to develop a new feed-forward amplifier which can dynamically produce ideal phase-inverted inter-modulation products that have almost identical amplitude, calibrated delay and inversed phase in comparison with the inter-modulation products output from the non-linear amplifier, hence intentional output signal without any inter-modulation products can be generated and, meanwhile redundant non-linear amplifier will not be introduced.

SUMMARY

One object of the present disclosure is to provide a feed-forward amplifier device and the method thereof, wherein the generation and adjusting of pure inter-modulation products can be performed in digital base band, such that better pure inter-modulation products may be generated for finally outputting an ideal signal.

According to one aspect of the present disclosure, there provides a feed-forward amplifier device comprising: a splitter for splitting an input signal into a first portion and a second portion; a non-linear amplifier for amplifying the first portion of the input signal and producing inter-modulation products; a carrier canceling unit for generating pure inter-modulation products based on the second portion of the input signal and the non-linear amplifier's output signal; a linear amplifier for amplifying the pure inter-modulation products; and a coupler after the non-linear amplifier for generating a final output signal by counteracting the inter-modulation products with the amplified pure inter-modulation products; wherein the splitter and the carrier canceling unit are provided in digital base band, and the splitter, carrier canceling unit, linear amplifier and coupler constitute a feed-forward loop for feeding forward the pure inter-modulation products into the coupler.

In one embodiment, the device further comprises another coupler after the non-linear amplifier, being used for coupling part of the non-linear amplifier's output signal; an observation receiver for feeding back the coupled output signal from the non-linear amplifier into the carrier canceling unit; wherein the splitter, non-linear amplifier, another coupler, observation receiver and carrier canceling unit constitute a first feedback loop for feeding back the non-linear amplifier's output signal into the carrier canceling unit.

In another embodiment, the device further comprises a vector adjustor after the carrier canceling unit in digital base band, being used for adjusting at least one of the amplitude, phase and delay of the pure inter-modulation products; wherein the vector adjustor is included in the feed-forward loop.

In yet another embodiment, the device further comprises a third coupler after the coupler, being used for coupling part of the final output signal and feeding back it to the observation receiver; a vector adjust parameter calculating unit for generating adjust parameters for the vector adjustor by comparing the final output signal from the observation receiver with the input signal from the splitter; wherein the splitter, the non-linear amplifier, the another coupler, the coupler, the third coupler, the observation receiver and the vector adjust parameter calculating unit constitute a second feedback loop, and the vector adjustor adjusts at least one of the amplitude, phase and delay of the pure inter-modulation products with the adjust parameters.

In still another embodiment, the device further comprises a plurality of switches for switching between the first feedback loop and the second feedback loop.

Herein, the pure inter-modulation products generated by the carrier canceling unit are phase inversed relative to the non-linear amplifier's output signal.

Alternatively, the vector adjustor comprises an amplitude adjustor for adjusting the amplitude of the pure inter-modulation products; a phase adjustor for adjusting the phase of the pure inter-modulation products; and/or a delay adjustor for calibrating the delay of the pure inter-modulation products.

Alternatively, the observation receiver comprises a mixer for down converting the feedback signal into an IF signal with lower frequency; an IF (Intermediate Frequency) filter for filtering out the high frequency interference and/or local oscillator leakage in the IF signal; and an ADC (analog-digital converter) for converting the IF signal into a digital signal in base band.

Alternatively, the device further comprises an amplitude compensator, a phase compensator and a delay compensator after the splitter, for compensating the amplitude, phase and delay of the input signal respectively.

Alternatively, the device further comprises a digital delayer after the splitter for compensating time delay in digital domain.

Alternatively, the device further comprises the following before the non-linear amplifier and the linear amplifier: DACs (digital-analog converters) for converting signals from digital signals into analog signals; and IQ (In-phase/Quadrature-phase) modulators for orthogonally modulating analog signals to a RF (Radio Frequency) carrier.

Alternatively, the device further comprises an analog delayer connected to the input of the coupler, being used for compensating the pure inter-modulation products propagation delay in the feed-forward loop.

Alternatively, the device further comprises a digital down converter after the observation receiver for down converting digitized signals to zero frequency in digital domain.

According to another aspect of the present disclosure, there provides a method for feed-forward amplifying a signal, comprising the steps of: splitting an input signal into two portions in digital base band; non-linearly amplifying the input signal in analog domain; generating pure inter-modulation products in digital base band; linearly amplifying the pure inter-modulation products in analog domain; generating a final output signal without inter-modulation products.

According to yet another aspect of the present disclosure, there provides a method for feed-forward amplifying a signal, comprising the steps of: splitting an input signal into two portions in digital base band; non-linearly amplifying the input signal in analog domain; feeding back the amplified input signal into digital base band; generating pure inter-modulation products in digital base band; linearly amplifying the pure inter-modulation products in analog domain; generating a final output signal without inter-modulation products.

In one embodiment, the method further comprises the step of adjusting the pure inter-modulation products in digital domain before the step of linearly amplifying, wherein at least one of the amplitude, phase and delay of the pure inter-modulation products are adjusted in digital domain.

In another embodiment, the method further comprises feeding back the final output signal into digital base band; generating adjust parameters by comparing the input signal with the final output signal; wherein the step of adjusting the pure inter-modulation products adjusts the pure inter-modulation products with the adjust parameters.

Herein, the pure inter-modulation products are generated based on one portion of the input signal and the non-linearly amplified input signal.

Herein, the final output signal is generated by counteracting the inter-modulation products from the non-linearly amplified input signal with the pure inter-modulation products.

According to the present disclosure, pure inter-modulation products can be generated and adjusted in digital base band, and hence may be adjusted more flexibly and more accurately. Consequently, the inter-modulation products of the non-linear amplifier's output signal can be counteracted as completely as possible.

Further, the solution according to the present disclosure observes the actual output signal and compares it with intentional input signal, hence the vector adjust parameters can be calculated dynamically. Advantageously, the actual output signal can be optimized as close to intentional input signal as possible.

In addition, according to the present disclosure, a redundant non-linear amplifier can be avoided to be introduced and thus the power efficiency can be improved.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
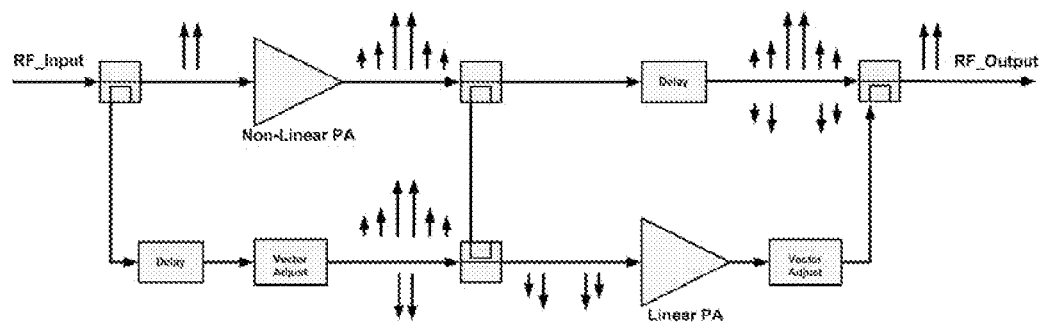
FIG. 1 shows the block diagram of a feed-forward amplifier.

Exemplary embodiments of the present disclosure are described in more details below with reference to the accompanying drawings. In the drawings, like reference numerals denote like members. The figures are not drawn to scale, for the sake of clarity.

Some particular details of the disclosure will be described below for a better understanding of the present disclosure. Nevertheless, it can be understood by one skilled person in the art that these details are not always essential for but can be varied in a specific implementation of the disclosure. Unless the context clearly indicates otherwise, each part of the device can be made of elements well known to one skilled person in the art.

Figure 2:
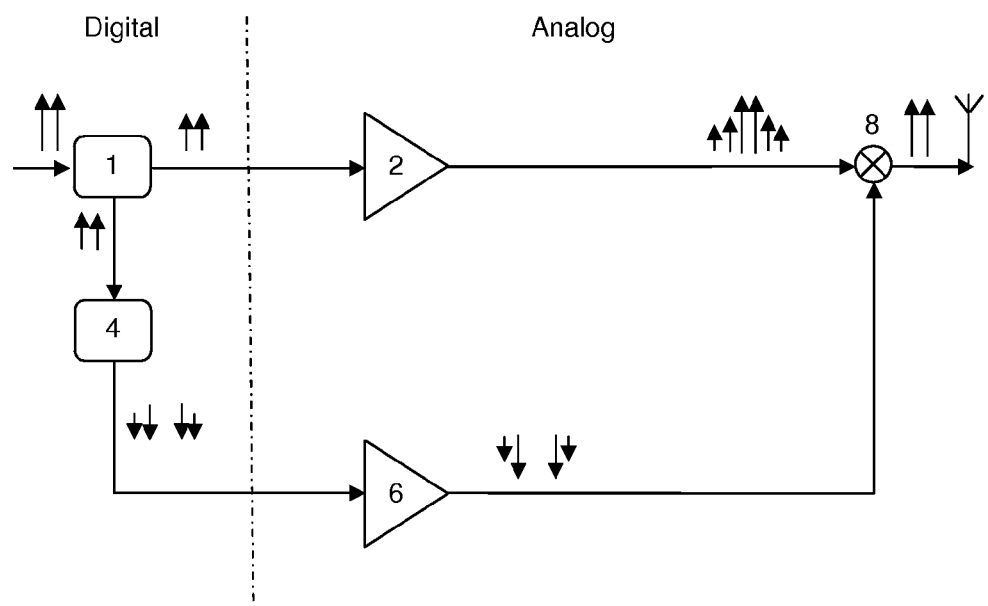
FIG. 2 shows a schematic diagram of a feed-forward amplifier according to a preferable embodiment of the present disclosure.

FIG. 2 shows a schematic diagram of a feed-forward amplifier according to a preferable embodiment of the present disclosure.

As shown in FIG. 2, the feed-forward amplifier comprises at least the following components: a splitter 1, a non-linear amplifier 2, a carrier canceling unit 4, a linear amplifier 6 and a coupler 8, wherein the splitter 1 and the carrier canceling unit 4 are provided in digital domain.

The splitter 1 splits an input signal into two portions, the first portion of the input signal will go along a first branch and is fed into the non-linear amplifier 2, the second portion will go along a second branch and is fed into carrier canceling unit 4.

The non-linear amplifier 2 amplifies the input signal with producing inter-modulation products, which is unwanted by a user and should be canceled to ensure that only intentional input signal is output from the non-linear amplifier 2.

The carrier canceling unit 4 is used to generate pure inter-modulation products (not containing any component of input signal) in digital base band with the second portion of the input signal received from the splitter 1. Herein, the generated pure inter-modulation products are phase inversed relative to the non-linear amplifier's inter-modulation output.

The linear amplifier 6 is used to amplify the amplitude of the pure inter-modulation products in analog domain and then output the amplified pure inter-modulation products to the coupler 8.

The coupler 8 is used to couple the amplified pure inter-modulation products from the linear amplifier 6 with the non-linear amplifier's output signal to counteract its unwanted inter-modulation products. Since the amplified pure inter-modulation products have almost identical amplitude, calibrated delay and inverse phase in comparison with the unwanted inter-modulation products output from the non-linear amplifier 2, the unwanted inter-modulation products can be counteracted almost completely from the non-linear amplifier's output signal. As a result, an ideal output signal without any inter-modulation products can be generated finally by the coupler 8 and be output through an antenna (not shown), which is almost identical with the intentional input signal.

As can be seen from the above, in this embodiment the splitter 1, carrier canceling unit 4, linear amplifier 6 and coupler 8 constitute a feed-forward loop to generate and feed-forward pure inter-modulation products into the coupler 8 to couple with the non-linear amplifier's output signal, such that an intentional output signal can be generated by counter-acting the unwanted inter-modulation products from the non-linear amplifier's output signal with the pure inter-modulation products.

A more important thing according to the present embodiment is that the splitter 1 and the carrier canceling unit 4 are provided in base band of digital domain and can be realized by digital technology, such as FPGA technology. Therefore, the pure inter-modulation products are possible to be adjusted in real time and accurately.

Figure 3:
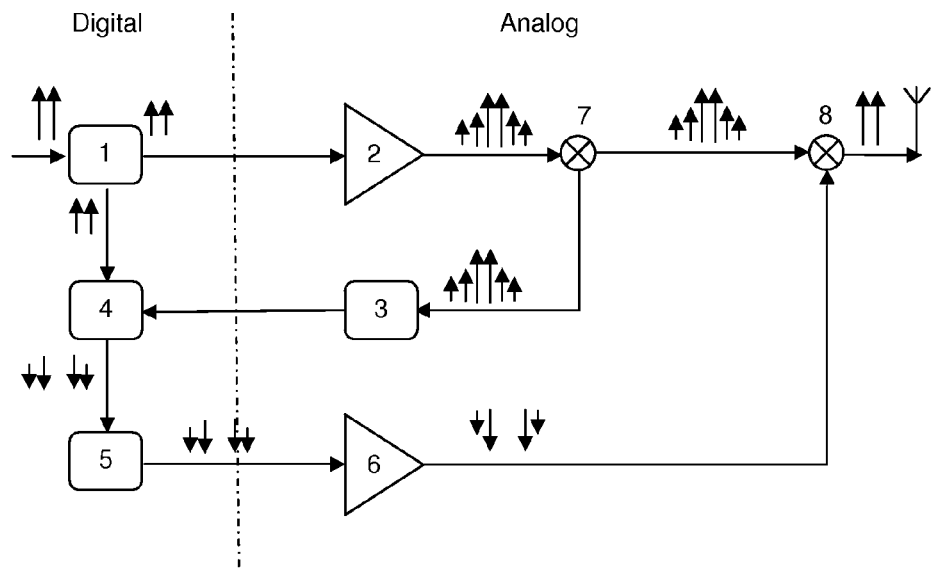
FIG. 3 shows a schematic diagram of a feed-forward amplifier according to another embodiment of the present disclosure.

FIG. 3 shows a schematic diagram of a feed-forward amplifier according to another embodiment of the present disclosure.

As shown in FIG. 3, the feed-forward amplifier comprises at least the following components: a splitter 1, a non-linear amplifier 2, an observation receiver 3, a carrier canceling unit 4, a vector adjustor 5, a linear amplifier 6, a first coupler 7 and second coupler 8 (corresponding to the coupler 8 described in FIG. 2). In this embodiment, the splitter 1, non-linear amplifier 2, first coupler 7, observation receiver 3 and carrier canceling unit 4 constitute a first feedback loop to feed-back the non-linear amplifier's output signal into the carrier canceling unit 4 for generation of pure inter-modulation products. Further, the splitter 1, carrier canceling unit 4, vector adjustor 5, linear amplifier 6 and second coupler 8 constitute a feed-forward loop to generate and feed-forward the pure inter-modulation products into the second coupler 8 to couple with the non-linear amplifier's output signal, such that an intentional output signal can be generated by counteracting the unwanted inter-modulation products from the non-linear amplifier's output signal with the pure inter-modulation products.

According to the present embodiment, the splitter 1, carrier canceling unit 4 and vector adjustor 5 are preferably provided in base band of digital domain and can be realized by digital technology, such as FPGA technology. Therefore, the carrier canceling unit and vector adjustor are possible to be adjusted in real time and accurately. On the other hand, the non-linear amplifier 2, observation receiver 3, linear amplifier 6, first coupler 7 and second coupler 8 are provide in analog domain.

The operating principle of this feed-forward amplifier device will be illustrated with reference to figures.

First, the first feedback loop above-mentioned will be described in details.

An input signal is input into splitter 1 which splits it into two portions, a first portion and second portion, wherein the first portion of the input signal will go along a first branch and is fed into the non-linear amplifier 2, the second portion will go along a second branch and is fed into carrier canceling unit 4.

The first portion of the input signal in the first branch is fed into a non-linear amplifier 2. The non-linear amplifier 2 amplifies the input signal and produces unwanted inter-modulation products, which should be canceled to ensure that only intentional input signal will be output from the non-linear amplifier 2.

The first coupler 7 after the non-linear amplifier 2 is used to couple part of the non-linear amplifier's output signal and feed it back to the input of the observation receiver 3, the part signal includes the amplified input signal and unwanted inter-modulation products.

The observation receiver 3 is used to feed-back part of the coupled output signal from the non-linear amplifier 2 (including the amplified input signal and unwanted inter-modulation products) into the carrier canceling unit 4.

The carrier canceling unit 4, receiving the second portion of the input signal from the splitter 1 and the feedback signal including the amplified input signal and unwanted inter-modulation products from the observation receiver 3, is used to subtract the input signal from the feedback signal to generate pure inter-modulation products (not containing any component of input signal) in base band. Herein, the generated pure inter-modulation products are phase inversed relative to the non-linear amplifier's inter-modulation output.

Now, the feed-forward loop above-mentioned will be described in details.

The pure inter-modulation products, generated by the carrier canceling unit 4, are fed into vector adjustor 5, which will adjust at least one of the amplitude, phase and delay of the pure inter-modulation products in digital base band when necessary. Speaking in detail, the vector adjustor 5 adjusts the input pure inter-modulation products so that they could have almost identical amplitude, calibrated delay and opposite phase in comparison with the inter-modulation products output from the non-linear amplifier 2.

The adjusted pure inter-modulation products output from the vector adjustor 5 will be sent into the linear amplifier 6 of the feed-forward loop in analog domain. The linear amplifier 6 is used to amplify the amplitude of the pure inter-modulation products in analog domain without changing the phase thereof. Then the linear amplifier 6 will output the amplified pure inter-modulation products to the second coupler 8. Since the amplified pure inter-modulation products have almost identical amplitude, calibrated delay and inverse phase in comparison with the unwanted inter-modulation products output from the non-linear amplifier 2, the unwanted inter-modulation products can be counteracted almost completely from the non-linear amplifier's output signal, thereby the intentional input signal can be output without any inter-modulation products.

The second coupler 8 after the first coupler 7 is used to couple the amplified pure inter-modulation products from the linear amplifier 6 with the non-linear amplifier's output signal to counteract its unwanted inter-modulation products. As a result, an ideal output signal is output from second coupler 8 through an antenna (not shown) which is almost identical with the intentional input signal.

With the device described above, some devices can be set up in digital domain to be controlled by digital manner. This will make them more flexible and more controllable. In addition, power loss and poor efficiency can be avoided.

Further, since the pure inter-modulation products are generated in digital domain, their amplitude, phase and delay can be dynamically adjusted in digital base band. As a result, intentional input signal could be output ideally without any inter-modulation products, meanwhile not introducing redundant non-linear amplifier.

Figure 4:
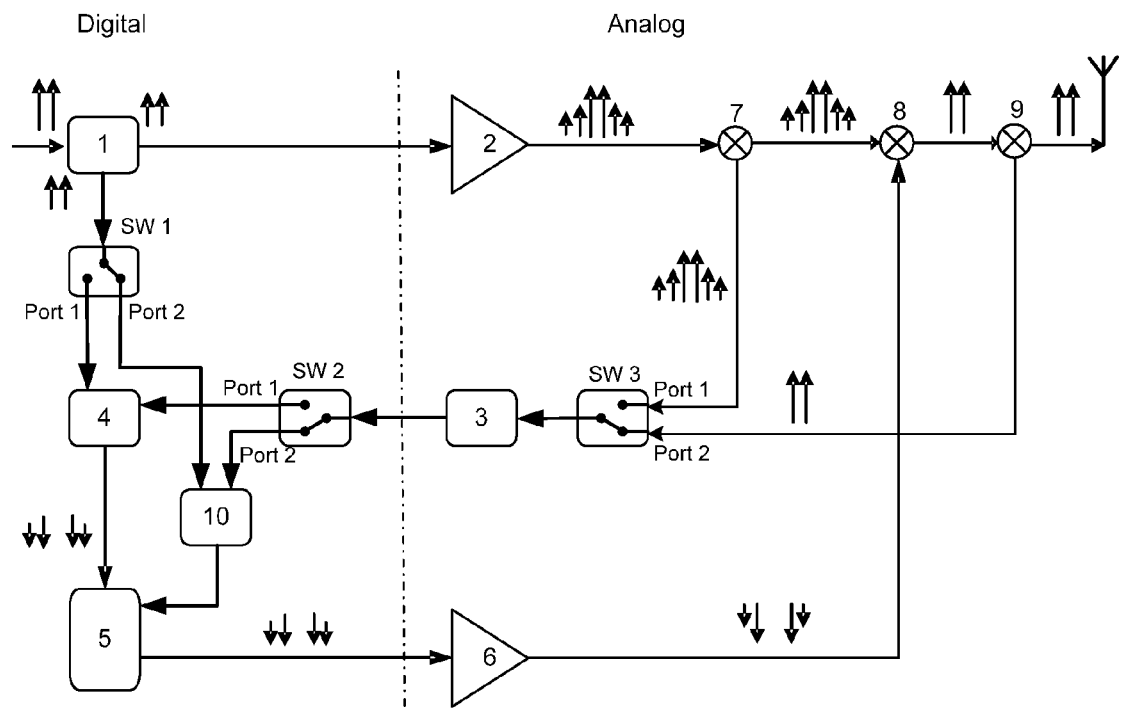
FIG. 4 shows a schematic diagram of a feed-forward amplifier according to another embodiment of the present disclosure.

FIG. 4 shows a schematic diagram of a feed-forward amplifier according to another embodiment of the present disclosure.

In addition to all of the components in the structure in FIG. 3, the feed-forward amplifier in this embodiment shown in FIG. 4 further comprises a third coupler 9 in analog domain and a vector adjust parameter calculating unit 10 in digital domain. In this embodiment, the splitter 1, non-linear amplifier 2, first coupler 7, second coupler 8, third coupler 9, observation receiver 3 and vector adjust parameter calculating unit 10 constitute a second feedback loop to feed-back the final output signal into the vector adjust parameter calculating unit 10 for generation of adjust parameters.

As shown in FIG. 4, for switching between the first feedback loop and the second feedback loop, there are provided with three switches including a first switch SW1, a second switch SW2 and a third switch SW3. When all of these switches are switched to Port 1, the first feedback loop is turned on and the second is off, and when they are switched to Port 2, the second feedback loop is turned on and the first is off.

With referring to FIG. 4 again, the third coupler 9 is provided after the second coupler 8 for coupling part of the second coupler's output signal and feeding-back it to the input of the observation receiver 3. Here, the second coupler' output signal is final output signal without inter-modulation products in ideal condition and is output from the third coupler 9 through an antenna (not shown).

In this case, the observation receiver 3 feeds back the coupled output signal (final output signal without inter-modulation products) from the third coupler 9 into the vector adjust parameter calculating unit 10.

In the vector adjust parameter calculating unit 10, on one hand, it receives original input signal from the splitter 1 via the first switch SW1. On the other hand, it receives the final output signal from the observation receiver 3 via the second switch SW2. By comparing the final output signal with the original input signal, the vector adjust parameter calculating unit 10 calculates optimized vector adjuster parameters such as amplitude, phase and delay and provide to vector adjuster 5 to adjust pure inter-modulation products in feed-forward path. Herein, the optimized vector adjuster parameters are used for the vector adjustor 5 to adjust at least one of the amplitude, phase and delay of the pure inter-modulation products in digital domain.

The first switch SW1 is provided between the splitter 1 and the carrier canceling unit 4 to selectively connects the splitter 1 with the carrier canceling unit 4 (Port 1) or the vector adjust parameter calculating unit 10 (Port 2). The second switch SW2 is provided between the observation receiver 3 and the carrier canceling unit 4 to selectively connects the observation receiver 3 with the carrier canceling unit 4 (Port 1) or the vector adjust parameter calculating unit 10 (Port 2). The third switch SW3 is provided between the observation receiver 3 and the first coupler 7 to selectively connects the observation receiver 3 with the first coupler 7 (Port 1) or the third coupler 9 (Port 2).

When all of the three switches are switched to Port 1, the first feedback loop is turned on and the observation receiver 3 is coupled to the non-linear amplifier's output signal containing intentional input signal and unwanted inter-modulation products. In this case the non-linear amplifier's output signal is coupled and fed back to the carrier canceling unit 4 for generation of pure inter-modulation products, as described in FIG. 3.

On the other hand, when all of the three switches are switched to Port 2, the second feedback loop is turned on such that the final output signal from the third coupler 9 is coupled and fed back into the vector adjust parameter calculating unit 10 of the control side in digital domain.

In this case, the observation receiver 3 receives the final output signal from the third coupler 9 and feeds back it into the vector adjust parameter calculating unit 10 in which, the final output signal is compared with the intentional input signal from the splitter 1 for resulting in an error between them. Therefore, based on this error, an optimized adjust parameter may be calculated containing adjust parameter for amplitude, phase and delay. Consequently, the vector adjustor 5 is capable of adjusting the amplitude, phase and delay of the pure inter-modulation products in digital domain more accurately and flexible and thus generating more precise pure inter-modulation products.

In summary, the final output signal will be compared with the original input signal (without inter-modulation products) in digital domain. In ideal situation, the final output signal should be identical with the original input signal in amplitude and phase. In practice, however, there is error between them, and the vector adjustor 5 will adjust the amplitude and phase of the pure inter-modulation products based on this error such that the error could be dynamically optimized as small as possible. The adjusted pure inter-modulation products are feed-forward into the second coupler 8 after being amplified by the linear amplifier 6, so as to counteract the unwanted inter-modulation products of the non-linear amplifier's output signal, thereby an ideal output signal can be generated from the second coupler 8, which is almost identical with the original input signal in amplitude and phase.

In a preferable embodiment, the three switches SW1, SW2 and SW3 can be controlled to turn on the second feedback loop in a predetermined frequency. For example, they can turn on in such a frequency that the first and second feedback loop operate alternately.

In this embodiment, the second feedback loop including third coupler 9 and vector adjust parameter calculating unit 10 is able to compare the original input signal from splitter 1 with the final output signal from third coupler 9, thus generate a optimized adjust parameter for the vector adjustor 5. With this optimized adjust parameter, the output of the vector adjustor 5 can be optimized, that is, the pure inter-modulation products can be adjusted so as to have almost identical amplitude, calibrated delay and opposite phase in comparison with the unwanted inter-modulation products output from the non-linear amplifier 2.

Figure 5:
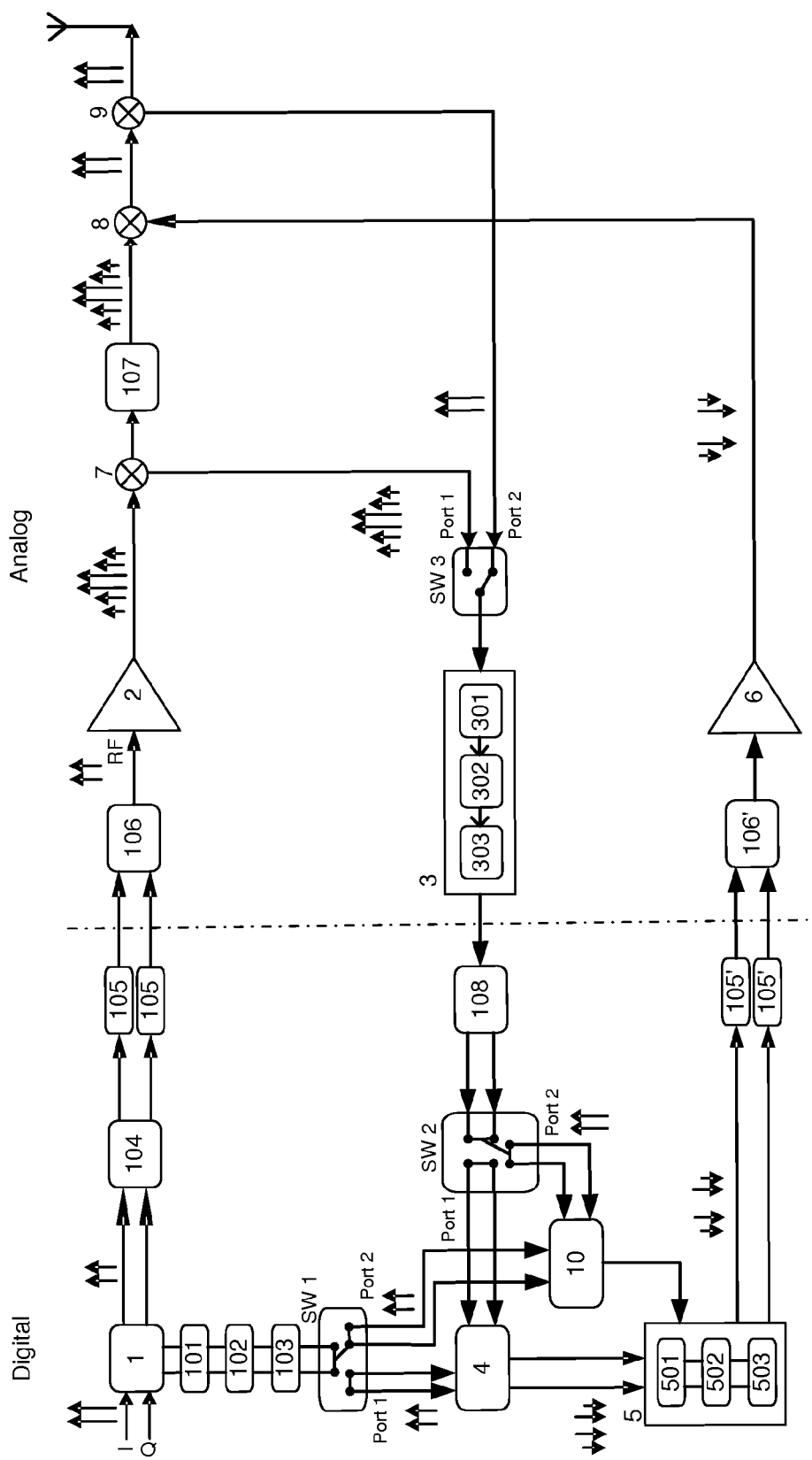
FIG. 5 shows an illustrative example of the feed-forward amplifier according to this disclosure.

FIG. 5 shows an illustrative example of the feed-forward amplifier according to this disclosure.

As shown in FIG. 5, an input signal is a two-tone signal containing two single-tone signals with same amplitude and start phase in frequency domain. The input signal contains two components orthogonal to each other such as In-phase (abbreviated as "I" hereinafter) and Quadrature-phase (abbreviated as "Q" hereinafter). The input signal can be expressed as I+jQ in complex base band.

The input signal is split into two portions going along two branches respectively. The first portion of the input signal will go along the first branch and is fed into the non-linear amplifier 2, the second portion will go along a second branch and is fed into carrier canceling unit 4 or vector adjust parameter calculating unit 10 depending on which of the first and second feedback loop is turned on.

As shown in FIG. 5, in the present embodiment the second branch could further comprise an amplitude compensator 101, a phase compensator 102, a delay compensator 103 after the splitter 1, for compensating the amplitude, phase and delay of the input signal respectively in this branch. The compensated input signal will be fed into carrier canceling unit 4 or vector adjust parameter calculating unit 10 through the first switch SW1, but in frequency domain it still just has two tone and no inter-modulation products.

Referring to FIG. 5 again, the first portion of the input signal goes to a digital delayer 104 after the splitter 1 for compensating time delay in digital domain, such as compensating the propagation delay of the input signal.

Next, the delayed input signal is fed into DACs (digital-analog converters) 105 for being converted from digital signals into analog signals to enter analog domain. As shown in FIG. 5, there are provided two DACs 105 for I signal and Q signal respectively. The IQ modulator 106 is used to up convert signals into RF, that is, to orthogonally modulate the analog signals of I and Q to a RF carrier. Finally the input signal is fed to the non-linear amplifier 2 in first branch. The first coupler 7 after the non-linear amplifier will couple part of the non-linear amplifier's output signal which includes amplified two-tone signal and inter-modulation products.

Preferably, an analog delayer 107 could be provided before the second coupler 8 for compensating the process delay in the first feedback loop (including but not limiting to, delay from the first coupler 7 for coupling output signal to the observation receiver 3) and the pure inter-modulation products propagation delay in the feed-forward loop, as shown in FIG. 5. The generation of pure inter-modulation products in the first feedback loop and the propagation of the pure inter-modulation products in the feed-forward loop are probable to lead in time delay. In this way, the two signals of the first path non-linear amplifier output and the feed-forward path linear amplifier output respectively at the input port and coupling port of the second coupler 8 can be calibrated in time domain. As a result, it can be sure that the unwanted inter-modulation products in first feedback loop can be counteracted with the pure inter-modulation products in the feed-forward loop.

Next, the non-linear amplifier's output signal is fed back to the input of the observation receiver 3 in the first feedback loop.

The observation receiver 3 comprises a mixer 301, an IF (Intermediate Frequency) filter 302, and an ADC (analog-digital converter) 303. The mixer 301 down converts the feedback signal into IF (Intermediate Frequency) signal with lower frequency for convenience of ADC sampling. The IF filter 302 filters out the high frequency interference and/or local oscillator leakage in IF signal. The ADC 303 is used to convert the IF signal into a digital signal in base band by sampling and digitalizing.

Next, the digitized signal will be down converted again to zero frequency by a digital down converter 108 after the observation receiver 3 in digital domain.

In the case of first feedback loop is turned on, in the carrier canceling unit 4, the feedback signal, i.e. the down converted observation receiver's output, will be subtracted by the input signal with loop delay and phase distortion compensated and amplitude normalized in digital domain. By subtracting the input signal from the feedback signal, the carrier canceling unit 4 generates pure inter-modulation products in base band, which is pure inter-modulation products not containing any component of input signal. Herein, the generated pure inter-modulation products are phase inversed relative to the non-linear amplifier's inter-modulation output.

Figure 6:
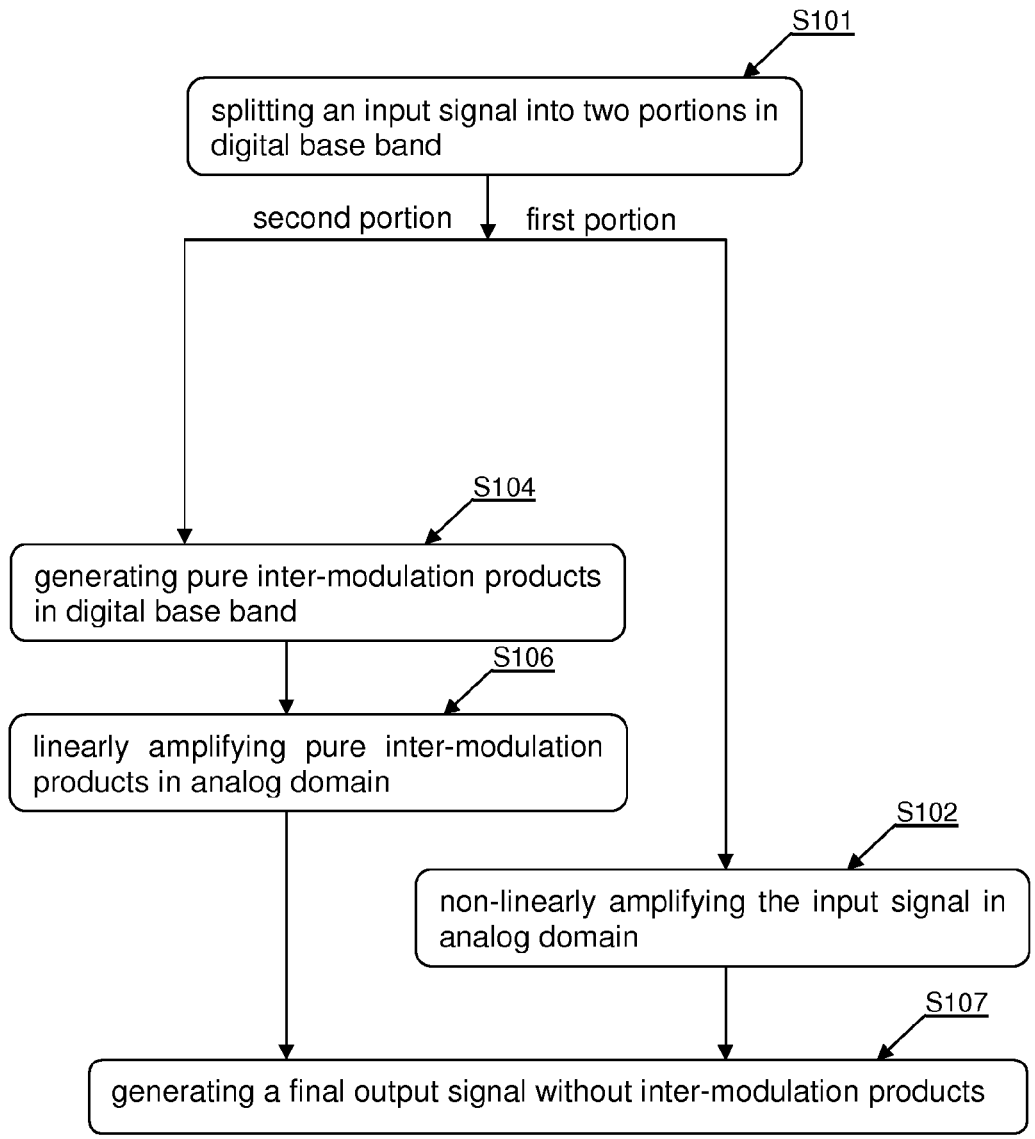
FIG. 6 is a flow chart illustrating a method for feed-forward amplifying a signal in accordance with an embodiment of the present disclosure.

The vector adjuster 5 in the feed-forward loop will adjust at least one of the amplitude, phase and delay of the pure inter-modulation products to be identical with that of the non-linear amplifier's inter-modulation output. As shown in FIG. 6, the vector adjustor 5 could comprise an amplitude adjustor 501, a phase adjustor 502 and a delay adjustor 503. The amplitude adjustor 501 is used to adjust the amplitude of the pure inter-modulation products, which could be realized with such as amplitude component of a complex multiplier in digital domain. The phase adjustor 502 is used to adjust the phase of the pure inter-modulation products, which could be realized with such as phase component of a complex multiplier in digital domain. The delay adjustor 503 is used to calibrate the delay of pure inter-modulation products caused in process, which can be realized with a digital delayer in digital domain.

The adjusted pure inter-modulation products will be converted to analog signals by two DACs 105' and then up converted to RF by IQ modulators 106' in the feed-forward loop comprising the linear amplifier 6. The linear amplifier 6 is used to amplify the amplitude of the pure inter-modulation products without changing the phase thereof. However, it is possible to introduce time delay in the linear amplifier 6.

Then the amplified pure inter-modulation products are coupled to the non-linear amplifier's RF output by second coupler 8 in the first path to counteract the inter-modulation products of the non-linear amplifier's output signal.

In the case of second feedback loop is turned on, in the vector adjust parameter calculating unit 10, the final output signal which is fed back from the third coupler 9 by the observation receiver 3 via the third switch SW3, after being down converted again to zero frequency by a digital down converter 108 in digital domain, will be compared with the original input signal from the splitter 1 with loop delay and phase distortion compensated and amplitude normalized in digital domain. By comparing original input signal with final output signal, the vector adjust parameter calculating unit 10 calculates vector adjuster parameters such as amplitude, phase and delay and provide to vector adjuster unit 5 to adjust pure inter-modulation products in feed-forward path, as mentioned above. Therefore, the vector adjuster unit 5 is capable of adjusting the amplitude, phase and delay of the pure inter-modulation products in real-time on the basis of the error between the original input signal and final output signal. Consequently, the generated pure inter-modulation products are expected to be more accurately such that the inter-modulation products of the non-linear amplifier's output signal can be counteracted as completely as possible.

FIG. 6 is a flow chart illustrating a method for feed-forward amplifying a signal in accordance with an embodiment of the present disclosure.

The method of feed-forward amplifying a signal in this embodiment is used in a feed-forward amplifier according to the present disclosure, for outputting intentional output signal without inter-modulation products.

With reference to FIG. 2 and FIG. 6, the method comprises the following steps.

Step S101, splitting input signal into two portions in digital base band.

The splitter 1 splits an input signal into two portions, the first portion of the input signal will go along a first branch and is fed into the non-linear amplifier 2, the second portion will go along a second branch and is fed into carrier canceling unit 4.

Step S102, non-linearly amplifying the input signal in analog domain.

The non-linear amplifier 2 amplifies the first portion of the input signal with producing unwanted inter-modulation products, which should be canceled to ensure that only intentional input signal is output from the non-linear amplifier 2.

Step S104, generating pure inter-modulation products in digital base band.

The carrier canceling unit 4 is used to generate pure inter-modulation products (not containing any component of input signal) in digital base band with the second portion of the input signal received from the splitter 1. Herein, the generated pure inter-modulation products are phase inversed relative to the non-linear amplifier's inter-modulation output.

Step S106, linearly amplifying pure inter-modulation products in analog domain.

The linear amplifier 6 is used to amplify the amplitude of the pure inter-modulation products in analog domain and then output the amplified pure inter-modulation products to the coupler 8.

Step S107, generating final output signal without inter-modulation products.

The coupler 8 is used to couple the amplified pure inter-modulation products from the linear amplifier 6 with the non-linear amplifier's output signal in step S102 to counteract its unwanted inter-modulation products. Since the amplified pure inter-modulation products have almost identical amplitude, calibrated delay and inverse phase in comparison with the unwanted inter-modulation products output from the non-linear amplifier 2, the unwanted inter-modulation products can be counteracted almost completely from the non-linear amplifier's output signal. As a result, an ideal output signal without any inter-modulation products can be generated finally by the coupler 8 and be output through an antenna (not shown), which is almost identical with the intentional input signal.

With the method described above, the pure inter-modulation products are generated in digital domain such that their amplitude, phase and delay can be dynamically adjusted in digital domain. As a result, intentional input signal could be output ideally without inter-modulation products.

Figure 7:
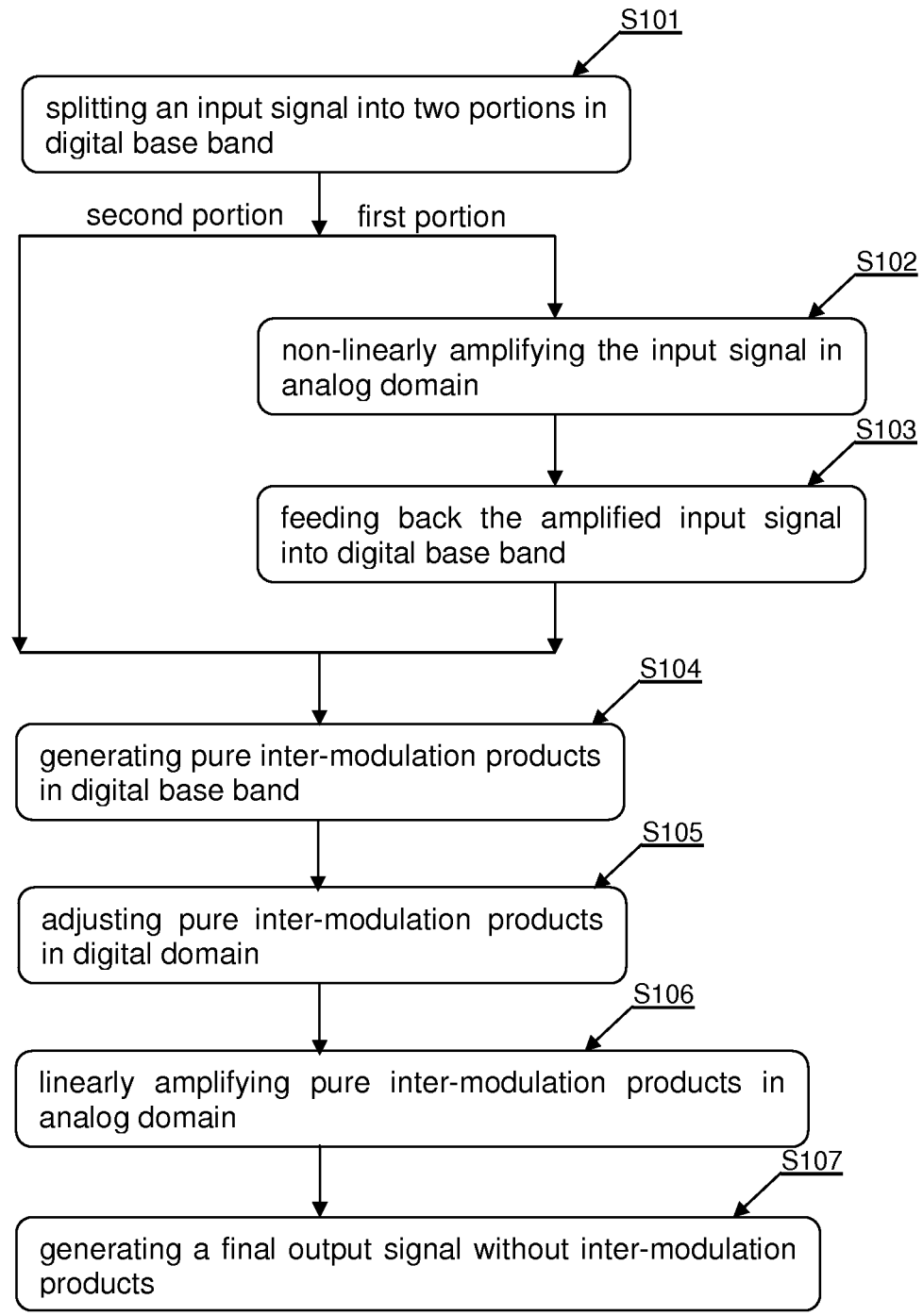
FIG. 7 is a flow chart illustrating a method for feed-forward amplifying a signal in accordance with an embodiment of the present disclosure.

FIG. 7 is a flow chart illustrating a method for feed-forward amplifying a signal in accordance with an embodiment of the present disclosure.

The method of feed-forward amplifying a signal in this embodiment is used in a feed-forward amplifier according to the present disclosure, for outputting intentional output signal without inter-modulation products. The method in this embodiment comprises all of the steps described in FIG. 6, with the addition of a feedback process for generating pure inter-modulation products and a step of adjusting the pure inter-modulation products.

With reference to FIG. 3 and FIG. 7, the method comprises the following steps.

Step S101, splitting input signal into two portions in digital base band.

An input signal is input into splitter 1 which splits it into two portions, a first portion and second portion, wherein the first portion of the input signal will go along a first branch and is fed into the non-linear amplifier 2, the second portion will go along a second branch and is fed into carrier canceling unit 4.

Step S102, non-linearly amplifying the input signal in analog domain.

The first portion of the input signal in the first branch is fed into a non-linear amplifier 2. The non-linear amplifier 2 amplifies the input signal and produces unwanted inter-modulation products, which should be canceled to ensure that only intentional input signal will be output from the non-linear amplifier 2.

Step S103, feeding back the amplified input signal into digital base band.

The first coupler 7 after the non-linear amplifier 2 is used to couple part of the non-linear amplifier's output signal and feed it back to the input of the observation receiver 3, the part signal includes the amplified input signal and unwanted inter-modulation products.

The observation receiver 3 is used to feed-back the coupled output signal from the non-linear amplifier (including the amplified input signal and unwanted inter-modulation products) into the carrier canceling unit 4.

Step S104, generating pure inter-modulation products in digital base band.

The carrier canceling unit 4, receiving the second portion of the input signal from the splitter 1 and the feedback signal including the amplified input signal and unwanted inter-modulation products from the observation receiver 3, is used to subtract the input signal from the amplified input signal to generate pure inter-modulation products (not containing any component of input signal) in digital base band. Herein, the generated pure inter-modulation products are phase inversed relative to the non-linear amplifier's inter-modulation output.

Step S105, adjusting pure inter-modulation products in digital domain.

The pure inter-modulation products, generated by the carrier canceling unit 4, are fed into vector adjustor 5, which will adjust at least one of the amplitude, phase and delay of the pure inter-modulation products in digital domain when necessary. Speaking in detail, the vector adjustor 5 adjusts the pure inter-modulation products so that they could have almost identical amplitude, calibrated delay and opposite phase in comparison with the inter-modulation products output from the non-linear amplifier 2.

Step S106, linearly amplifying pure inter-modulation products in analog domain.

The adjusted pure inter-modulation products output from the vector adjustor 5 will be sent into the linear amplifier 6 of the feed-forward loop in analog domain. The linear amplifier 6 is used to amplify the amplitude of the pure inter-modulation products in analog domain without changing the phase thereof. Then the linear amplifier 6 will output amplified pure inter-modulation products to the second coupler 8. The amplified pure inter-modulation products have almost identical amplitude, calibrated delay and opposite phase in comparison with the unwanted inter-modulation products output from the non-linear amplifier 2, such that the unwanted inter-modulation products can be counteracted almost completely from the non-linear amplifier's output signal, thereby the intentional input signal can be output without any inter-modulation products.

Step S107, generating final output signal without inter-modulation products.

The second coupler 8 after the first coupler 7 is used to couple the amplified pure inter-modulation products from the linear amplifier 6 with the non-linear amplifier's output signal to counteract its unwanted inter-modulation products. As a result, an ideal output signal is output from second coupler 8 through an antenna (not shown) which is almost identical with the intentional input signal.

With the method described above, pure inter-modulation products can be generated in digital domain such that their amplitude, phase and delay can be dynamically adjusted in digital domain. As a result, intentional input signal could be output ideally without inter-modulation products.

Figure 8:
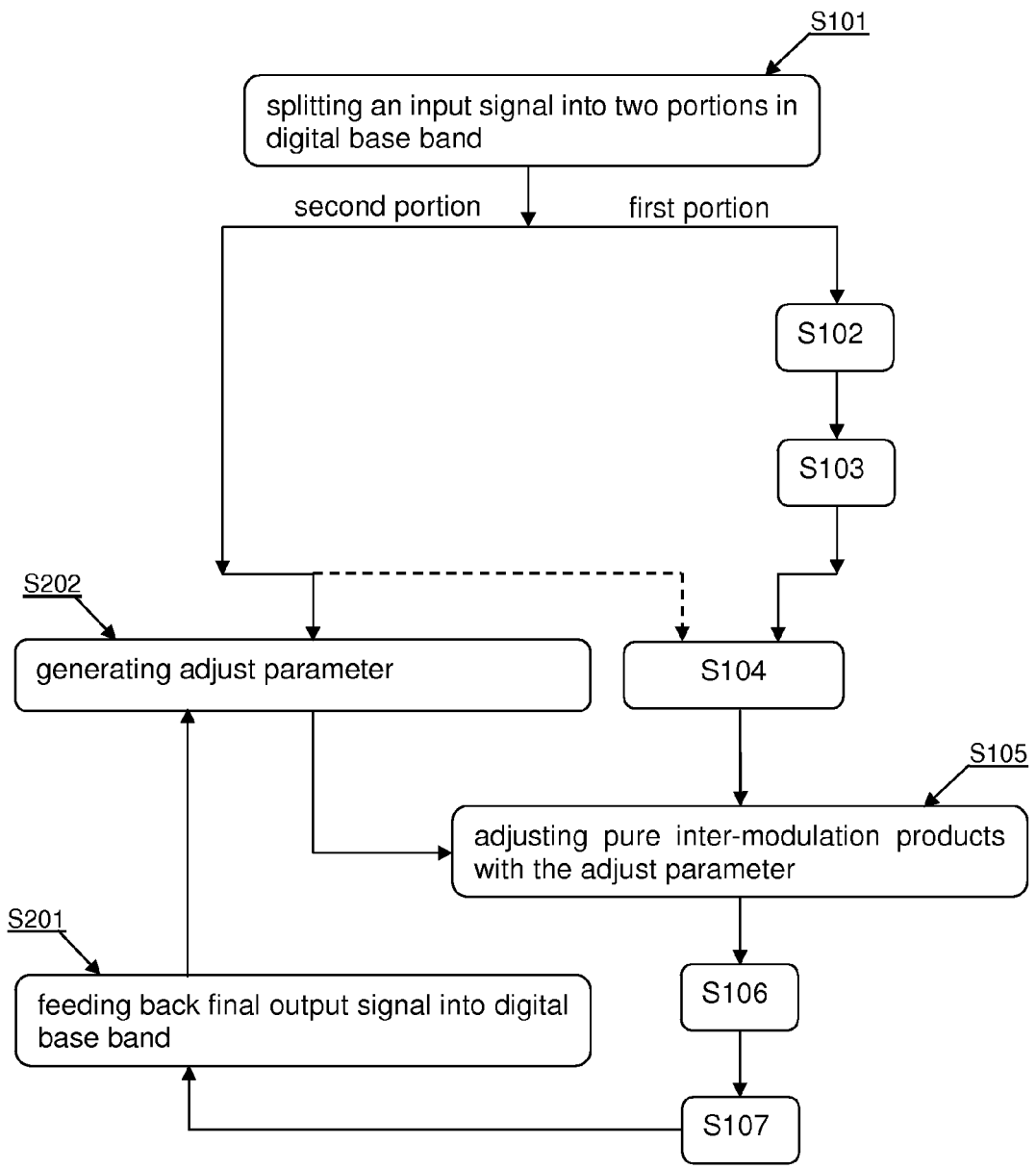
FIG. 8 is a flow chart illustrating a method of feed-forward amplifying a signal in accordance with another embodiment of the present disclosure.

FIG. 8 is a flow chart illustrating a method of feed-forward amplifying a signal in accordance with another embodiment of the present disclosure.

The method of feed-forward amplifying a signal in this embodiment is used in a feed-forward amplifier according to another embodiment of the present disclosure, for outputting intentional output signal without inter-modulation products. The method in this embodiment comprises all of steps in the method shown in FIG. 7, and it is different in that it further comprises steps of generating adjust parameter for optimizing the adjusting step of S105.

With reference to FIG. 4 and FIG. 8, the method further comprises the steps of generating adjust parameter as below.

Step S201, feeding back final output signal into digital base band.

With referring to FIG. 4, the third coupler 9 is provided after the second coupler 8 for coupling part of the final output signal and feed-back it to the input of the observation receiver 3. The observation receiver 3 feeds back the coupled output signal (final output signal without inter-modulation products) from the third coupler 9 into the vector adjust parameter calculating unit 10.

Step S202, generating adjust parameters.

In the vector adjust parameter calculating unit 10, on one hand, it receives original input signal (second portion in step S101) from the splitter 1 via the first switch SW1. On the other hand, it receives the final output signal from the observation receiver 3 via the second switch SW2 (in step S201). By comparing the final output signal with the original input signal, the vector adjust parameter calculating unit 10 calculates optimized vector adjuster parameters for such as amplitude, phase and delay and provide to vector adjuster 5 for adjusting pure inter-modulation products in feed-forward path.

In FIG. 8, the dotted line pointing to step S104 means that the second portion of the input signal will be sent to the carrier canceling unit 4 for generation of pure inter-modulation products in another case.

In step S105, the vector adjustor 5 will adjust at least one of the amplitude, phase and delay of the pure inter-modulation products in digital domain with the optimized vector adjuster parameters generated in step S202. Consequently, the vector adjustor 5 can adjust the pure inter-modulation products more accurately and flexible and thus more precise pure inter-modulation products may be generated.

Other arrangements of the present disclosure include software programs performing the steps and operations of the method embodiments, which are firstly generally described and then explained in detail. More specifically, a computer program product is such an embodiment, which comprises a computer-readable medium with a computer program logic encoded thereon. The computer program logic provides corresponding operations to provide the above described schemes of feed-forward amplification when it is executed on a computing device. The computer program logic enables at least one processor of a computing system to perform the operations (the methods) of the embodiments of the present disclosure when it is executed on the at least one processor. Such arrangements of the present disclosure are typically provided as: software, codes, and/or other data structures provided or encoded on a computer-readable medium such as optical medium (e.g., CD-ROM), soft disk, or hard disk; or other mediums such as firmware or microcode on one or more ROM or RAM or PROM chips; or an Application Specific Integrated Circuit (ASIC); or downloadable software images and share database, etc., in one or more modules. The software, hardware, or such arrangements can be mounted on computing devices, such that one or more processors in the computing device can perform the technique described by the embodiments of the present disclosure. Software process operating in combination with e.g., a group of data communication devices or computing devices in other entities can also provide the nodes and host of the present disclosure. The nodes and host according to the present disclosure can also be distributed among a plurality of software processes on a plurality of data communication devices, or all software processes running on a group of mini specific computers, or all software processes running on a single computer.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing description gives only the embodiments of the present disclosure and is not intended to limit the present disclosure in any way. Thus, any modification, substitution, improvement or like made within the spirit and principle of the present disclosure should be encompassed by the scope of the present disclosure.

ABBREVIATIONS

ADC Analog-Digital Converter
DAC digital-analog converter
IF Intermediate Frequency
IQ In-phase/Quadrature-phase
RF Radio Frequency

What is claimed is:

1. A feed-forward amplifier device comprising:
  a splitter for splitting an input signal into a first portion and a second portion;
  a first set of digital-analog converters (DACs) for converting the first portion of the input signal from a digital format to an analog format;
  a first set of in-phase/quadrate-phase (IQ) modulators for orthogonally modulating the first portion of the input signal to a radio frequency (RF) carrier;
  a non-linear amplifier for amplifying the first portion of the input signal and producing inter-modulation products;
  a carrier canceling unit for generating pure inter-modulation products based on the second portion of the input signal and the non-linear amplifier's output signal;
  a second set of DACs for converting the pure inter-modulation products from a digital format to an analog format;
  a second set of IQ modulators for orthogonally modulating the pure inter-modulation products to another RF carrier;
  a linear amplifier for amplifying the pure inter-modulation products; and a coupler after the non-linear amplifier for generating a final output signal by counteracting the inter-modulation products with the amplified pure inter-modulation products;

wherein the splitter and the carrier canceling unit are provided in digital base band, and the splitter, carrier canceling unit, linear amplifier, and coupler constitute a feed-forward loop for feeding forward the pure inter-modulation products into the coupler, digital-analog converters (DACs) for converting signals from digital signals into analog signals; and in-phase/quadrate-phase (IQ) modulators for orthogonally modulating analog signals to a radio frequency (RF) carrier.

2. The device according to claim 1, further comprising:
a second coupler after the non-linear amplifier, for coupling part of the non-linear amplifier's output signal;
an observation receiver for feeding back the coupled output signal from the non-linear amplifier into the carrier canceling unit;
wherein the splitter, non-linear amplifier, second coupler, observation receiver, and carrier canceling unit constitute a first feedback loop for feeding back the non-linear amplifier's output signal into the carrier canceling unit.

3. The device according to claim 2, further comprising:
a vector adjustor after the carrier canceling unit in digital base band, for adjusting at least one of an amplitude, phase, and delay of the pure inter-modulation products;
wherein the vector adjustor is included in the feed-forward loop.

4. The device according to claim 3, further comprising:
a third coupler after the coupler, for coupling part of the final output signal and feeding back it to the observation receiver;
a vector adjust parameter calculating unit for generating adjust parameters for the vector adjustor by comparing a final output signal from the observation receiver with an input signal from the splitter;
wherein the splitter, the non-linear amplifier, the second coupler, the coupler, the third coupler, the observation receiver, and the vector adjust parameter calculating unit constitute a second feedback loop, and the vector adjustor adjusts at least one of an amplitude, phase, and delay of the pure inter-modulation products with the adjust parameters.

5. The device according to claim 4, further comprising a plurality of switches for switching between the first feedback loop and the second feedback loop.

6. The device according to claim 1, wherein the pure inter-modulation products generated by the carrier canceling unit are phase inversed relative to the non-linear amplifier's output signal.

7. The device according to claim 3, wherein the vector adjustor further comprises:
an amplitude adjustor for adjusting the amplitude of the pure inter-modulation products;
a phase adjustor for adjusting the phase of the pure inter-modulation products; and/or
a delay adjustor for calibrating the delay of the pure inter-modulation products.

8. The device according to claim 2, wherein the observation receiver further comprises:
a mixer for down converting a feedback signal into an intermediate frequency (IF) signal with lower frequency;
an IF filter for filtering out high frequency interference and/or local oscillator leakage in the IF signal; and
an analog-digital converter (ADC) for converting the IF signal into a digital signal in base band.

9. The device according to claim 1, further comprising an amplitude compensator, a phase compensator, and a delay compensator after the splitter, for compensating the amplitude, phase and delay of the input signal, respectively.

10. The device according to claim 1, further comprising a digital delayer after the splitter for compensating time delay in digital domain.

11. The device according to claim 1, further comprising an analog delayer connected to an input of the coupler, for compensating a process delay in the first feedback loop and/or a pure inter-modulation products propagation delay in the feed-forward loop.

12. The device according to claim 2, further comprising a digital down converter after the observation receiver for down converting digitized signals to zero frequency in digital domain.

13. A method for feed-forward amplifying a signal, the method comprising of:
splitting an input signal into a first portion and a second portion in digital base band;
converting the first portion of the input signal from a digital format to an analog format;
orthogonally modulating the first portion of the input signal to a radio frequency (RF) carrier;
non-linearly amplifying the first portion of the input signal in analog domain;
generating pure inter-modulation products in digital base band based at least on the second portion of the input signal;
converting the pure inter-modulation products from a digital format to an analog format;
orthogonally modulating the pure inter-modulation products to another RF carrier;
linearly amplifying the pure inter-modulation products in analog domain; and
generating a final output signal without inter-modulation products.

14. A method for feed-forward amplifying a signal, the method comprising of:
splitting an input signal into a first portion and a second portion in digital base band;
converting the first portion of the input signal from a digital format to an analog format;
orthogonally modulating the first portion of the input signal to a radio frequency (RF) carrier;
non-linearly amplifying the input signal in analog domain;
feeding back the amplified input signal into digital base band;
generating pure inter-modulation products in digital base band based at least on the second portion of the input signal;
converting the pure inter-modulation products from a digital format to an analog format;
orthogonally modulating the pure inter-modulation products to another RF carrier;
linearly amplifying the pure inter-modulation products in analog domain; and
generating a final output signal without inter-modulation products.

15. The method according to claim 14, further comprising adjusting the pure inter-modulation products in digital domain before linearly amplifying, wherein at least one of an amplitude, phase and delay of the pure inter-modulation products are adjusted in digital domain.

16. The method according to claim 15, further comprising:
feeding back the final output signal into digital base band;
generating adjust parameters by comparing the input signal with the final output signal;
wherein adjusting the pure inter-modulation products comprises adjusting the pure inter-modulation products with the adjust parameters.

17. The method according to claim 13, wherein the pure inter-modulation products are generated based on one portion of the input signal and the non-linearly amplified input signal.

18. The method according to claim 13, wherein the final output signal is generated by counteracting inter-modulation products from the non-linearly amplified input signal with the pure inter-modulation products.

* * * * *